(12) United States Patent
Newlin

(10) Patent No.: US 8,981,856 B1
(45) Date of Patent: Mar. 17, 2015

(54) HIGH FREQUENCY PRECISION OSCILLATORS HAVING STABLE TEMPERATURE CHARACTERISTICS

(71) Applicant: Integrated Device Technology, Inc., San Jose, CA (US)

(72) Inventor: Trevor Newlin, Laguna Hills, CA (US)

(73) Assignee: Integrated Device Technology, Inc., San Jose, CA (US)

(*) Notice: Subject to any disclaimer, the term of this patent is extended or adjusted under 35 U.S.C. 154(b) by 0 days.

(21) Appl. No.: 14/015,837

(22) Filed: Aug. 30, 2013

Related U.S. Application Data

(60) Provisional application No. 61/791,010, filed on Mar. 15, 2013.

(51) Int. Cl.
*H03L 7/00* (2006.01)
*H03L 7/06* (2006.01)

(52) U.S. Cl.
CPC .................................. *H03L 7/06* (2013.01)
USPC .............................. 331/17; 331/186; 327/155

(58) Field of Classification Search
USPC ............ 327/105, 146, 147, 155, 156; 331/16, 331/17, 57, 177 R, 185, 186; 375/373–376
See application file for complete search history.

(56) References Cited

U.S. PATENT DOCUMENTS

| | | | |
|---|---|---|---|
| 4,904,960 A | 2/1990 | Izadinia et al. | |
| 6,690,240 B2 * | 2/2004 | Maxim et al. | 331/17 |
| 7,002,418 B2 * | 2/2006 | Zhu et al. | 331/17 |
| 7,417,510 B2 | 8/2008 | Huang | |
| 7,532,081 B2 | 5/2009 | Partridge et al. | |
| 7,668,279 B1 * | 2/2010 | You et al. | 375/376 |
| 7,724,097 B2 | 5/2010 | Carley et al. | |
| 8,422,615 B2 * | 4/2013 | Den Besten | 375/356 |
| 8,559,587 B1 | 10/2013 | Buell et al. | |

* cited by examiner

*Primary Examiner* — Levi Gannon
(74) *Attorney, Agent, or Firm* — Myers, Bigel, et al.

(57) ABSTRACT

An oscillator circuit includes an adjustable frequency oscillator configured to free-run at a first frequency below a desired second target frequency. This adjustable frequency oscillator is configured to modulate a frequency of its periodic output signal upwards from the first frequency to the second frequency in response to a feedback bias current. A divider is also provided, which is configured to convert the periodic output signal to a reduced-frequency control signal. This reduced-frequency control signal is provided to a frequency-to-current (F2C) converter, which is configured to drive the adjustable frequency oscillator with the feedback bias current (e.g., pull-down current) in response to the reduced-frequency control signal.

13 Claims, 3 Drawing Sheets

HIGH FREQUENCY PRECISION OSCILLATORS HAVING STABLE TEMPERATURE CHARACTERISTICS

REFERENCE TO PRIORITY APPLICATION

This application claims priority to U.S. Provisional Application Ser. No. 61/791,010, filed Mar. 15, 2013, the disclosure of which is hereby incorporated herein by reference.

FIELD OF THE INVENTION

The present invention relates to integrated circuit devices and, more particularly, to frequency synthesizer circuits and methods of operating same.

BACKGROUND

Most oscillators required for silicon do not need crystal-level performance, but may still need a significant degree of accuracy. Typical oscillator designs often require an external resistor and/or capacitor to set a frequency. Unfortunately, even if accurately trimmed on-board components are used to maintain accuracy at high frequency, significant current consumption requirements may be required. Often, the best accuracy that can be achieved is 3% over an operating temperature range. Moreover, as will be understood by those skilled in the art, high frequency oscillators are particularly difficult to hold an accurate frequency unless they are locked to a known good reference, such as a crystal oscillator or resonator. But, these devices are typically implemented as off-chip components and may require significant amounts of power and add significantly to system cost. A typical implementation of a integrated circuit oscillator utilizes a high frequency voltage-controlled oscillator (VCO) divided down and compared to a known crystal oscillator (XO) or external resonator using a phase locked loop (PLL). Thus, a standard 10 MHz crystal could be used to generate a 32 MHz clock using a divider and a PLL. Other implementations can also require a large current (I) and/or large capacitance (C) to minimize the effects of parasitic variation with temperature. Unfortunately, high speed capacitors typically require large currents and the die area for such solutions can be substantial. Another example of an integrated circuit oscillator is disclosed in U.S. Pat. No. 4,904,960 to Izadinia et al., entitled "Precision CMOS Oscillator Circuit."

As illustrated by FIG. 1A, a conventional frequency synthesizer 10 may include a fractional-N divider 12 within a feedback path of a phase-locked loop (PLL), which filters jitter in the output of the divider 12. This fractional-N divider 12 may operate by modulating between two or more integer values. The phase-locked loop of FIG. 1A contains a phase detector 14, which receives an input reference signal (e.g., 25 MHz), a charge pump 16, a loop filter 18 and a voltage-controlled oscillator (VCO) 20. This VCO 20 generates an output signal having a frequency that is a non-integer multiple of the frequency of the input reference signal. An integer divider 22 may also be provided for generating an output signal at a reduced frequency relative to the VCO output signal. Examples of the frequency synthesizer 10 of FIG. 1A are disclosed at U.S. Pat. No. 7,532,081 to Partridge et al., entitled "Frequency and/or Phase Compensated Microelectromechanical Oscillator," and FIG. 3 of U.S. Pat. No. 7,417,510 to Huang, entitled "Direct Digital Interpolative Synthesis".

FIG. 1B illustrates a frequency synthesizer 10', which includes an integer divider 12' within a feedback path of a phase-locked loop (PLL). This phase-locked loop contains a phase detector 14, which receives an input reference signal (e.g., 25 MHz), a charge pump 16, a loop filter 18 and a voltage-controlled oscillator (VCO) 20, which generates an output signal having a frequency that is an integer multiple of the frequency of the input reference signal. Multiple fractional-N dividers 22a-22d may be provided for generating output signals having different frequencies, which do not have integer relationships with the output frequency of the VCO 20. As will be understood by those skilled in the art, additional circuitry may be needed to reduce jitter in the signals generated by the dividers 22a-22d. The dividers 22a-22d may be provided as interpolative dividers as disclosed at FIGS. 4-6 of the '510 patent to Huang. For example, as shown by FIG. 5 of Huang, an interpolative divider can include a fractional-N divider, which receives a VCO clock. A first order delta sigma modulator receives a digital divide ratio (MIN). The integer portion of the digital divide ratio is supplied to the fractional-N divider as a divide control signal, which can be a stream of integers that approximate the fractional divide ratio. A digital quantization error, which corresponds to the fractional portion of the divide ratio, is supplied to a digitally controlled phase interpolator. The jitter introduced by the fractional-N divider can be canceled by interpolation in the phase interpolator, which is based on the digital quantization error supplied by the delta sigma modulator. In this manner, the input clock from the VCO is first divided down by the fractional-N divider according to the control information provided by the delta sigma modulator and then the phase interpolator operates to cancel quantization errors in the output of the fractional-N divider. Additional examples of fractional-N frequency synthesizers, which utilize an accumulator within a numerically-controlled oscillator and a phase interpolator, are disclosed at FIG. 6 of the '510 patent to Huang and in U.S. Pat. No. 7,724,097 to Carley et al., entitled "Direct Digital Synthesizer for Reference Frequency Generation." A frequency synthesizer that utilizes segmented accumulators to support fractional division is disclosed in commonly assigned U.S. application Ser. No. 13/425,761 to Buell, entitled "Fractional-N Dividers Having Divider Modulation Circuits Therein With Segmented Accumulators," the disclosure of which is hereby incorporated herein by reference.

SUMMARY OF THE INVENTION

An oscillator circuit according to embodiments of the invention includes an adjustable frequency oscillator (e.g., dual ramp oscillator) configured to free-run at a first frequency below a desired second target frequency. This adjustable frequency oscillator is configured to modulate a frequency of its periodic output signal upwards from the first frequency to the second frequency in response to a feedback bias current. A divider (e.g., divide-by-$2^N$) is also provided, which is configured to convert the periodic output signal to a reduced-frequency control signal. This reduced-frequency control signal is provided to a frequency-to-current (F2C) converter, which is configured to drive the adjustable frequency oscillator with the feedback bias current (e.g., pull-down current) in response to the reduced-frequency control signal.

According to some embodiments of the invention, the frequency-to-current converter includes a cascaded arrangement of a frequency-to-voltage converter and an error amplifier. This frequency-to-voltage converter is configured to perform a frequency-to-voltage conversion at the frequency of the reduced-frequency control signal. In some of these embodiments of the invention, the frequency-to-voltage converter is responsive to a bandgap reference voltage. In other embodiments of the invention, the frequency-to-voltage converter includes a ramp generator and the error amplifier includes a sampling amplifier. In some further embodiments of the invention, the frequency-to-voltage converter may include a frequency measurement decoder, which is electrically coupled to a plurality of stages within the divider.

According to still further embodiments of the invention, a bias signal generator is provided, which is configured to generate a first bias voltage. This first bias voltage is provided to the frequency-to-current converter. The frequency-to-current converter may also be configured to generate the feedback bias current at a first output thereof and this first output may be electrically coupled to the adjustable frequency oscillator and the bias signal generator.

DETAILED DESCRIPTION OF EMBODIMENTS

Figure 1A:
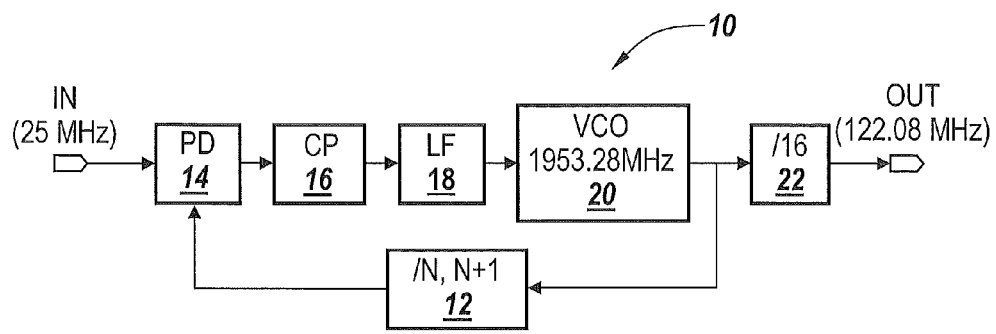
FIG. 1A is a block diagram of a frequency synthesizer that utilizes a fractional-N divider within a feedback path of a phase-locked loop (PLL), according to the prior art.
Figure 1B:
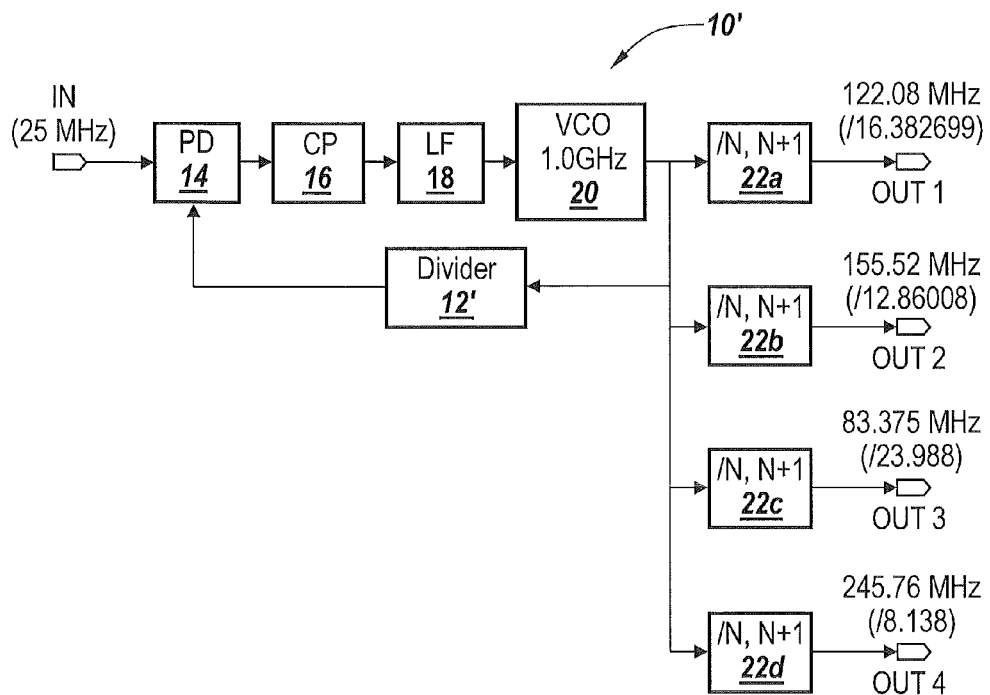
FIG. 1B illustrates a frequency synthesizer that utilizes an integer divider within a feedback path of a phase-locked loop (PLL), according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the present invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
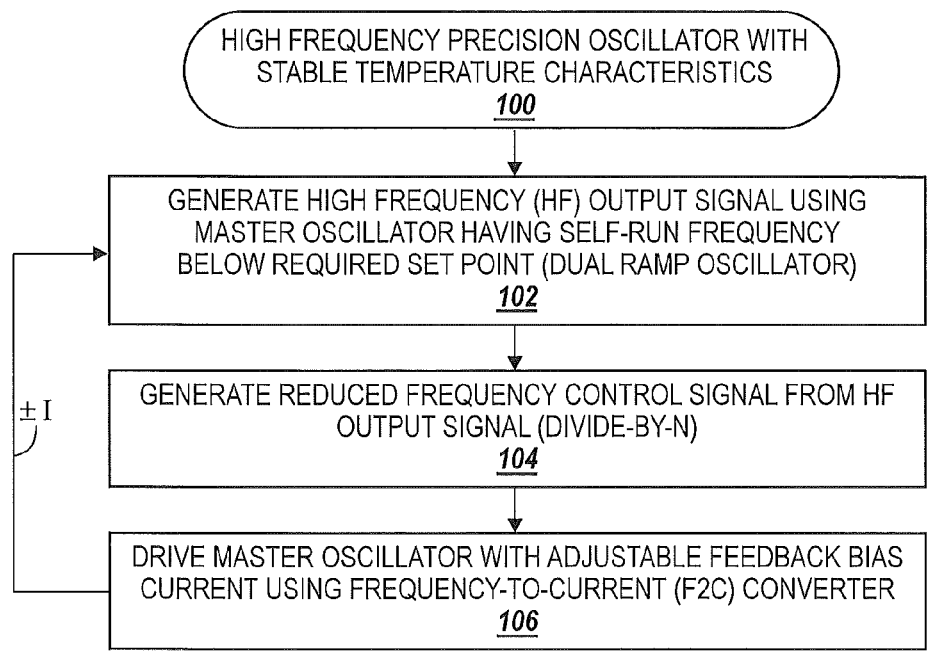
FIG. 2A is a flow diagram that illustrates operations of a high frequency precision oscillator circuit, according to an embodiment of the present invention.

Referring now to FIG. 2A, a flow diagram of operations 100 performed by a high frequency precision oscillator will be described. As shown by Block 102, a relatively high frequency (HF) output signal (e.g., 8 MHz, 16 MHz, 32 MHz, 64 MHz, etc.) is generated using an adjustable frequency oscillator (AFO). This AFO may be configured as a master oscillator having a self-run frequency setting below a required set point to achieve, among other things, reduced power consumption. As will be understood by those skilled in the art, this master oscillator may be configured as a dual-ramp oscillator. The oscillator circuit disclosed in the aforementioned U.S. Pat. No. 4,904,960 to Izadinia et al., entitled "Precision CMOS Oscillator Circuit," may also be utilized as an adjustable frequency oscillator. Referring now to Block 104, a reduced frequency control signal(s) may be generated from the HF output signal. This relatively low frequency control signal(s) may be generated using a divide-by-N or divide-by-$2^N$ divider. An adjustable feedback bias current is then generated, Block 106, and provided as a sourcing/sinking current (I) to the master oscillator. This bias current, which is designed to boost and efficiently regulate the frequency of the HF output signal, may be generated using a frequency-to-current (F2C) converter.

Figure 2B:
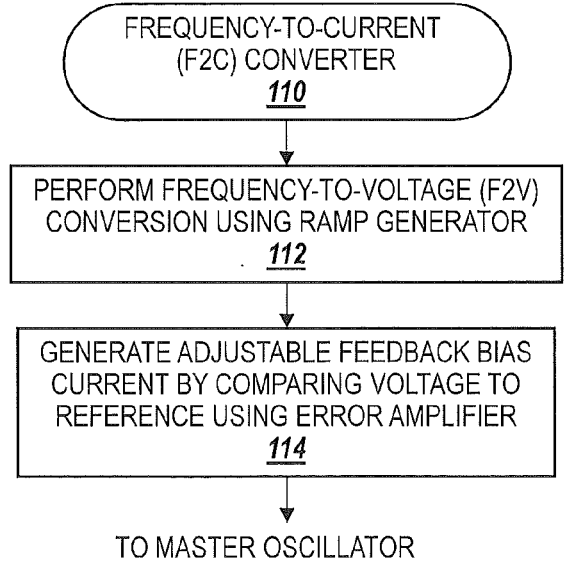
FIG. 2B is a flow diagram that illustrates operations of a frequency-to-current (F2C) converter, according to an embodiment of the present invention.

In particular, as shown by FIG. 2B, an embodiment of a frequency-to-current (F2C) converter 110 may be configured to perform a precise frequency-to-voltage (F2V) conversion operation on the reduced frequency control signal(s) using, for example, a ramp generator, Block 112, and then generate the feedback bias current (±I) by comparing a voltage generated by the F2V to a reference voltage (e.g., $V_{bandgap}$) using, for example, a sampling error amplifier (SEA), Block 114. In some embodiments of the invention, the reference voltage may be generated as a bandgap reference voltage using, for example, a stable capacitor (e.g., most oxide based capacitors provide near zero TC) and a zero TC current source, which may be relatively easily realized because polysilicon resistors having near zero temperature coefficient of resistance are often available on silicon (Si). In this manner, a relatively low frequency F2V can be made to be very precise. In addition, by adjusting the master oscillator using a biasing current (±I) instead of a voltage (or a trip threshold for the ramp generator), a reduced loop gain (see, e.g., FIG. 3A) can be used, which provides for higher stability and faster settling time.

Figure 3A:
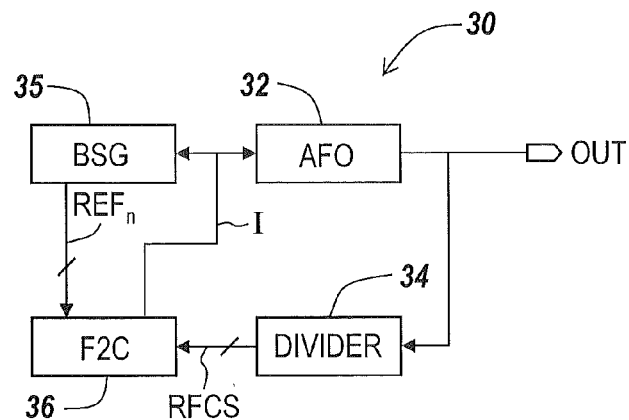
FIG. 3A is a block diagram of a high frequency precision oscillator circuit, according to an embodiment of the present invention.

FIG. 3A is a block diagram of an embodiment of a high frequency precision oscillator circuit 30, which includes an adjustable frequency oscillator (AFO) 32, a divider 34, a frequency-to-current (F2C) converter 36 and a bias signal generator (BSG) 35, connected as illustrated. The adjustable frequency oscillator 32 (e.g., dual-ramp oscillator) is preferably configured to free-run at a first frequency below a target second frequency of its periodic output signal (OUT). The divider 34 (e.g., divide-by-32, divide-by-8) is configured to convert the periodic output signal to a reduced-frequency control signal(s) (RFCS). This control signal(s) is provided as an input to the frequency-to-current (F2C) converter 36. This converter 36 drives the oscillator 32 with a feedback bias current (sinking or sourcing current I) and is responsive to a bias signal(s) REFn generated by the bias signal generator 35, which may also receive the bias current (I). In particular, the divider 34, F2C converter 36 and bias signal generator 35 collectively operate as a feedback loop control circuit, which regulates the AFO 32 and thereby the frequency of the output signal OUT by enabling the AFO 32 to support its own trimming.

Figure 3B:
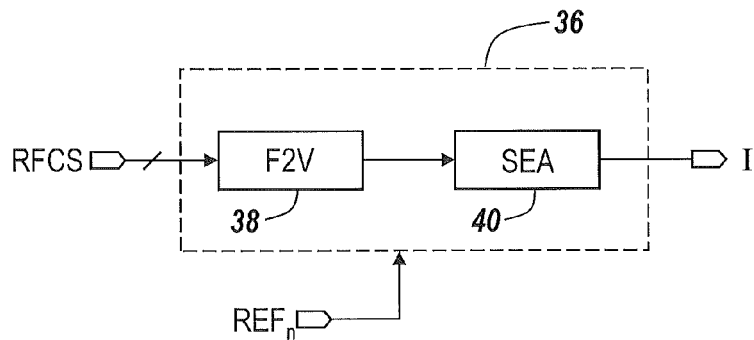
FIG. 3B is a block diagram of a frequency-to-current (F2C) converter, according to an embodiment of the present invention.

As shown by FIG. 3B, an embodiment of the F2C converter 36 includes a frequency-to-voltage (F2V) converter 38, which passes a variable control voltage to a sampling error amplifier (SEA) 40. Similar to a phase-locked loop (PLL), the settling time of the F2V converter 38 is a function of the amount of jitter that can be tolerated in the loop and the divide output frequency. Fortunately, because the F2V converter 38 can be scaled by adjusting the current and/or capacitance, an exact divide is not required to get the required frequency and the current needed to compensate for process variations can be trimmed relatively easily.

Figure 3C:
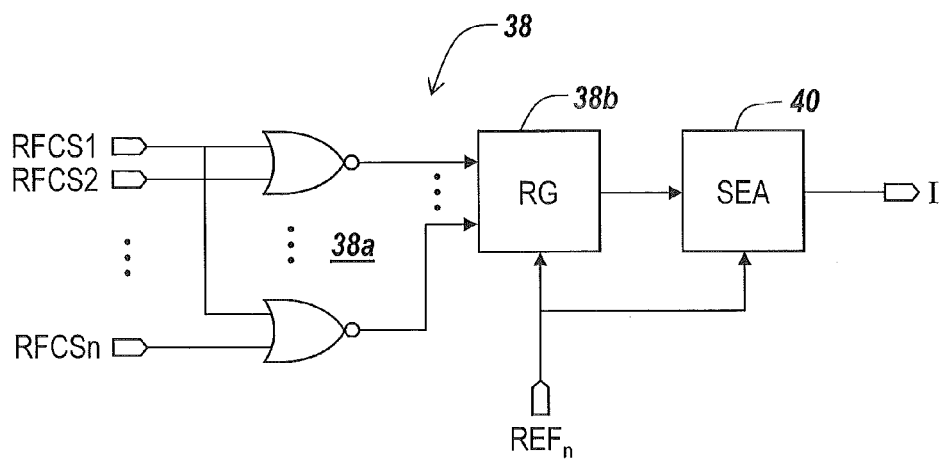
FIG. 3C is an electrical schematic of a frequency-to-voltage (F2V) converter, according to an embodiment of the present invention.

As illustrated by FIG. 3C, F2V converter 38 may be configured as a frequency measurement decoder 38a that feeds signals to a ramp generator 38b. This decoder 38a may be configured as a plurality of logic gates (e.g., NOR gates) having respective inputs electrically coupled to a plurality of stages (e.g., D-type flip-flops) within the divider 34 that generate respective ones of the reduced frequency control signals (RFCS1, . . . , RFCSn), as highlighted more fully by the aforementioned U.S. Provisional Application Ser. No. 61/791,010, filed Mar. 15, 2013, the disclosure of which is hereby incorporated herein by reference.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An oscillator circuit, comprising:
an adjustable frequency oscillator configured to free-run at a first frequency below a desired second frequency, said adjustable frequency oscillator configured to modulate a frequency of its periodic output signal upwards from the first frequency to the second frequency in response to a feedback bias current;
a divider configured to convert the periodic output signal to a reduced-frequency control signal; and
a frequency-to-current converter configured to drive the adjustable frequency oscillator with the feedback bias current in response to the reduced-frequency control signal, said frequency-to-current converter comprising a cascaded arrangement of a frequency-to-voltage converter and an error amplifier, said frequency-to-voltage converter comprising a ramp generator and said error amplifier comprising a sampling amplifier.

2. The oscillator circuit of claim 1, wherein the frequency-to-voltage converter is responsive to a bandgap reference voltage.

3. The oscillator circuit of claim 1, wherein the frequency-to-voltage converter is configured to perform a frequency-to-voltage conversion at the frequency of the reduced-frequency control signal.

4. The oscillator circuit of claim 3, wherein said divider is configured to perform a divide-by-$2^N$ operation, where N is an integer greater than two.

5. The oscillator circuit of claim 1, wherein the frequency-to-voltage converter comprises a frequency measurement decoder electrically coupled to a plurality of stages within said divider.

6. The oscillator circuit of claim 1, further comprising a bias signal generator configured to generate a first bias voltage, which is provided to said frequency-to-current converter.

7. The oscillator circuit of claim 6, wherein said frequency-to-current converter is configured to generate the feedback bias current at a first output thereof; and wherein said adjustable frequency oscillator and said bias signal generator are electrically coupled to the first output of said frequency-to-current converter.

8. The oscillator circuit of claim 1, wherein said adjustable frequency oscillator is a dual-ramp oscillator.

9. An oscillator circuit, comprising:
an oscillator configured to modulate a frequency of its periodic output signal in response to a feedback bias current;
a divider configured to convert the periodic output signal to a reduced-frequency control signal; and
a frequency-to-current converter configured to drive said oscillator with the feedback bias current in response to the reduced-frequency control signal, said frequency-to-current converter comprising a cascaded arrangement of a frequency-to-voltage converter, which comprises a ramp generator, and a sampling error amplifier.

10. The oscillator circuit of claim 9, wherein the frequency-to-voltage converter comprises a frequency measurement decoder electrically coupled to a plurality of stages within said divider.

11. The oscillator circuit of claim 9, further comprising a bias signal generator configured to generate a first bias voltage, which is provided to said frequency-to-current converter.

12. The oscillator circuit of claim 11, wherein said frequency-to-current converter is configured to generate the feedback bias current at a first output thereof; and wherein said adjustable frequency oscillator and said bias signal generator are electrically coupled to the first output of said frequency-to-current converter.

13. The oscillator circuit of claim 9, wherein said oscillator is a dual-ramp oscillator.

* * * * *